United States Patent
Hong et al.

(10) Patent No.: US 7,125,608 B2
(45) Date of Patent: Oct. 24, 2006

(54) SINGLE-CRYSTAL SILICON INGOT AND WAFER HAVING HOMOGENEOUS VACANCY DEFECTS, AND METHOD AND APPARATUS FOR MAKING SAME

(75) Inventors: Young Ho Hong, Gumi (KR); Ill Soo Choi, Gumi (KR); Sang Hee Kim, Seoul (KR); Man Seok Kwak, Daejeon-si (KR); Hong Woo Lee, Gumi (KR)

(73) Assignee: Siltron Inc., Gumi (KR)

( * ) Notice: Subject to any disclaimer, the term of this patent is extended or adjusted under 35 U.S.C. 154(b) by 44 days.

(21) Appl. No.: 11/001,888

(22) Filed: Dec. 1, 2004

(65) Prior Publication Data

US 2005/0120944 A1    Jun. 9, 2005

(30) Foreign Application Priority Data

Dec. 3, 2003    (KR) ............... 10-2003-0087179
Dec. 3, 2003    (KR) ............... 10-2003-0087180

(51) Int. Cl.
  B32B 9/04     (2006.01)
  C30B 29/06    (2006.01)
(52) U.S. Cl. ............... 428/446; 428/64.1; 423/348; 117/935
(58) Field of Classification Search ........... 428/64.1, 428/446; 423/348; 117/13, 935
  See application file for complete search history.

(56) References Cited

U.S. PATENT DOCUMENTS

| | | | |
|---|---|---|---|
| 6,337,219 B1 * | 1/2002 | Nishikawa | 438/14 |
| 6,348,180 B1 * | 2/2002 | Iida et al. | 423/348 |
| 6,482,260 B1 * | 11/2002 | Sakurada et al. | 117/20 |
| 6,802,899 B1 * | 10/2004 | Tamatsuka | 117/13 |

FOREIGN PATENT DOCUMENTS

| | | |
|---|---|---|
| JP | 8-91983 | 4/1996 |
| JP | 11-43393 | 2/1999 |
| JP | 11-43396 | 2/1999 |
| JP | 11-43397 | 2/1999 |
| JP | 2001-2491 | 1/2001 |
| JP | 2001-261494 | 9/2001 |
| JP | 2002-121096 | 4/2002 |
| KR | 1999-0037160 | 5/1999 |
| KR | 2002-0019025 | 3/2002 |
| KR | 2002-0026379 | 4/2002 |
| KR | 2002-0082132 | 10/2002 |

(Continued)

OTHER PUBLICATIONS

Zimmerman et al., "Vacancy concentration wafer mapping in silicon", Journal of Crystal Growth 129, (1993) pp. 582-592.*

(Continued)

*Primary Examiner*—Stephen Stein
(74) *Attorney, Agent, or Firm*—Christie, Parker and Hale, LLP

(57) ABSTRACT

The present invention improves upon the Czochralski method for growing a single-crystal silicon ingot and provides a high quality silicon wafer having an oxide layer with superior voltage-resistance characteristics. An apparatus and method are also provided, whereby vacancy defect density and distribution are uniformly controlled. A single-crystal silicon ingot is grown under a condition where the temperature variation of the ingot is less than or equal to 20° C./cm in the temperature range of 1000 to 1100° C.

13 Claims, 8 Drawing Sheets
(1 of 8 Drawing Sheet(s) Filed in Color)

FOREIGN PATENT DOCUMENTS

| KR | 2003-0059222 | 7/2003 |
| KR | 2003-0059293 | 7/2003 |
| KR | 2003-0086990 | 11/2003 |
| WO | WO 200134882 A1 * | 5/2001 |

OTHER PUBLICATIONS

Patent Abstract of Japan, Publication No. 08091983 A, Published on Apr. 9, 1996, in the name of Harada, et al.

Patent Abstract of Japan, Publication No. 11043393 A, Published on Feb. 16, 1999, in the name of Nakai, et al.

Patent Abstract of Japan, Publication No. 11043396 A, Published on Feb. 16, 1999, in the name of Ohashi, et al.

Patent Abstract of Japan, Publication No. 11043397 A, Published on Feb. 16, 1999, in the name of Hasebe, et al.

Patent Abstract of Japan, Publication No. 2001002491 A, Published on Jan. 9, 2001, in the name of Sugizaki, et al.

Patent Abstract of Japan, Publication No. 2001261494 A, Published on Sep. 26, 2001, in the name of Fu, et al.

Patent Abstract of Japan, Publication No. 2002121096 A, Published on Apr. 23, 2002, in the name of Kubo, et al.

Korean Patent Abstract, Publication No. 1999-0037160, Published on May 25, 1999, in the name of Iida, et al.

Korean Patent Abstract, Publication No. 2002-0019025, Published on Mar. 9, 2002, in the name of Hoshi, et al.

Korean Patent Abstract, Publication No. 2002-0026379, Published on Apr. 9, 2002, in the name of Kojima, et al.

Korean Patent Abstract, Publication No. 1020020082132 A, Published on Oct. 30, 2002, in the name of Fusegawa, et al.

Korean Patent Abstract, Publication No. 2003-0059222, Published on Jul. 7, 2003, in the name of Voronkov, et al.

Korean Patent Abstract, Publication No. 2003-0059293, Published on Jul. 7, 2003, in the name of Kojima, et al.

Korean Patent Abstract, Publication No. 2003-0086990, Published on Nov. 12, 2003, in the name of Kim, et al.

Voronkov, "The Mechanism of Swirl Defects Formation in Silicon," Journal of Crystal Growth 59 (© 1982) pp. 625-643.

* cited by examiner

FIG. 2 Prior Art

Ava

Radial direction of the ingot

Ava

Radial direction of the ingot

SINGLE-CRYSTAL SILICON INGOT AND WAFER HAVING HOMOGENEOUS VACANCY DEFECTS, AND METHOD AND APPARATUS FOR MAKING SAME

CROSS-REFERENCE TO RELATED APPLICATION

This application claims priority of Korean Patent Application Nos. 10-2003-0087179 and 10-2003-0087180, each filed Dec. 3, 2003, the entire disclosures of which are incorporated herein by reference.

BACKGROUND OF THE INVENTION (a) Field of the Invention

The present invention relates to a method for growing a single-crystal silicon ingot based on the Czochralski method, and more particularly to an apparatus and method for growing the single-crystal silicon ingot while maintaining a uniform growing condition and cooling condition in a radial direction of the ingot; and the single-crystal silicon ingot and wafers produced therefrom, having uniform vacancy defects in a radial direction.

(b) Description of the Related Art

The voltage-resistance characteristic of an oxide layer of a semiconductor device fabricated from a single-crystal silicon substrate can be represented by the tolerable voltage and time before the silicon oxide layer formed on the silicon wafer is destroyed and the insulating property of the silicon oxide layer disappears. It is well known that semiconductor device characteristics, including the voltage-resistance characteristic of an oxide layer, change according to the method of fabricating the single-crystal silicon substrate.

For example, a silicon substrate made of single-crystal silicon grown by the Czochralski (CZ) method is inferior to that of single-crystal silicon fabricated by the float zone method or a substrate fabricated by silicon epitaxial growth on a wafer prepared from single-crystal silicon grown by the Czochralski (CZ) method, in view of the voltage-resistance characteristics of an oxide layer. Yet, despite its drawbacks, the CZ method is the most common technique used for manufacturing a single-crystal ingot for silicon wafers, which are used for electronic devices such as semiconductors. The CZ method is less expensive and has been widely used to prepare semiconductor materials for large-scale integration (LSI), and does yield materials having good mechanical and electrical characteristics.

As electronic devices become more highly integrated and minimized, the gate oxide layer is required to have improved reliability. Since the voltage-resistance characteristic of an oxide layer is a primary material characteristic determining the reliability of the device, there is a strong need for a single-crystal silicon production technique capable of securing the superior voltage-resistance characteristic of an oxide layer, while still using the Czochralski method.

In the CZ method, a seed crystal is dipped into a silicon melt and then slowly pulled away from the melt, growing the ingot. The growth of the ingot is carried out through several processes.

First, a necking process is carried out to form a slender and long neck portion from the seed crystal. Second, a shouldering process is carried out to grow the crystal radially to obtain a target diameter. Third, a body-growing process is performed to obtain a crystal having a uniform diameter. Here, a part of the body of the ingot is made into a wafer.

After the body growing process, a tailing process is performed to slowly decrease the diameter of the ingot and separate the ingot from the silicon melt.

These processes for growing the crystal ingot are carried out in a space called a "hot zone," which includes a heater inside a grower, and other heat insulating components.

The defect characteristics of a single crystal sensitively depend on the growing and cooling conditions of the crystal, and there has been much effort to control the species and distribution of the defects formed during the growth (so-called "growth defects") by adjusting the thermal environment near a growth interface.

The growth defects are divided into categories: vacancy-type defects and interstitial-type defects. They are caused by an agglomeration of the vacancy point defects or interstitial point defects, which starts from being more than an equilibrium concentration.

The Voronkov theory, introduced in "The Mechanism of Swirl Defects Formation in Silicon", Journal of Crystal Growth 59 (1982) 625, teaches that growth defect formation is closely related to a value of V/G wherein V is a growing speed and G is a temperature gradient in the crystal near the crystal growing interface.

A vacancy-type defect is formed when the value of V/G exceeds a critical value, and an interstitial-type defect is formed when the value of V/G is lower than the critical value. Thus, the species, size, and density of the defects existing in the crystal are influenced by the pulling speed when the crystal grows in a given hot zone.

FIG. 1 is a cross sectional view of a crystal ingot growing by the CZ method, illustrating a typical defect distribution developed while controlling the growing speed such that an oxidation-induced staking fault (OISF) ring 200 is located around the circumferential edge of the ingot in a typical growth environment.

FIG. 2 is an image taken by minority carrier life time (MCLT) scanning on a cross-sectional surface of the single-crystal silicon ingot grown using the Czochralski CZ method in a typical growth environment.

As shown in FIG. 2, micro-vacancy defects, such as direct surface oxide defects (DSOD), exist around the exterior circumferential part of the ingot, since the cooling speed at the ingot exterior is faster than that at the interior of the ingot. Furthermore, coarse-vacancy defects, such as crystal originated particles (COP) or flow pattern defects (FPD), exist in the ingot interior since the value of G increases as one moves from the center of the ingot to the circumferential edge of the ingot.

In a single-crystal silicon grown by the Czochralski method, a primary factor decreasing the voltage-resistance characteristic of the oxide layer is micro-defects having a size smaller than a critical value, which are formed by the vacancy defects introduced into the crystal while pulling the single-crystal silicon ingot.

In order to improve the voltage-resistance characteristic of the oxide layer, the present invention controls the temperature gradient (G) in an axial (vertical) direction at a solid-liquid interface of the crystal and/or the initial concentration of the point defect when the silicon melt solidifies into the single-crystal silicon.

In another approach, the cooling speed of the crystal is controlled in a temperature range between the solidification temperature and about 1000°, in which the nuclei of defects is are formed and grows during the thermal processing history while the molten silicon is solidified into the single-crystal silicon. In this manner the silicon interstitials or vacancies diffuse forward to the side surfaces of the ingot or are accelerated to recombine mutually, so that it is possible to suppress the super-saturation of the interstitial or vacancy below the critical value at which the agglomeration occurs.

The introduced vacancy defects are grown through the diffusion, nuclei generation, and solidification according to the thermal history distribution of the hot zone. There has been effort to remove or reduce crystal originated particles (COP), which adversely affect the voltage-resistance characteristics of the single crystal silicon.

As shown in FIG. 1, if the ingot is grown in the pulling direction such that the oxidation-induced stacking fault ring exists at the typical hot zone, coarse vacancy defects are formed at the center part of the ingot due to heat accumulation and slow cooling effects. Since the cooling speed in the region between the exterior of the center part and the interior of the oxidation-induced staking fault ring is faster than that at the center part of the ingot, micro-vacancy defects are formed, and the vacancy defects are not uniformly distributed in the radial direction.

Also, the micro-vacancy defects formed due to fast cooling deteriorate the voltage-resistance characteristic of the oxide layer, and this occurs around the exterior circumferential part of the wafer at which the rate of cooling is relatively high.

Accordingly, in order to reduce these vacancy defects that cause problems in semiconductor devices made with single-crystal silicon wafers, it is required to decrease the pulling speed of the growing ingot. However, lowering the pulling speed causes a loss in productivity, and excessive reduction of the pulling speed is likely to, increase the formation of interstitial defects. A different approach is needed.

SUMMARY OF THE INVENTION

The present invention improves upon the Czochralski (CZ) method of manufacturing single-crystal silicon ingots, and provides a method of manufacture, an apparatus for single-crystal silicon ingot and wafer production; and high quality, low defect, single-crystal silicon ingots and wafers.

According to the method, the temperature variation of a region of the ingot being grown using the Czochralski method is minimized in the temperature range from 1000 to 1100° C. More specifically, the temperature variation of the single-crystal silicon ingot is no more than 20° C./cm in a region of the ingot in which the temperature is from 1000 to 1100° C. Preferably, the temperature controlled variation occurs at an outer circumferential part of the ingot in the vertical direction. Also, the temperature of the growing ingot is controlled such that there is no more than 1.5°/cm difference in the temperature gradients of the center part and the outer circumferential part of the ingot when the ingot is at a temperature of from 1000 to 1100°.

Preferably, the single-crystal silicon ingot is grown in a manner such that a vertical temperature gradient at an interface between the ingot and the silicon melt at a center portion of the ingot is greater than or equal to 20°/cm. To facilitate this improved method, an apparatus for growing single-crystal silicon ingots is provided and includes a chamber; a crucible installed (located) in the chamber for containing silicon melt; a heater for heating the crucible; a heat shield installed between the ingot and the crucible to surround the single-crystal ingot for shielding the heat radiating from the ingot; and a local heating element for adjusting the temperature variation of the ingot and control such variation (temperature gradient) to be less than or equal to 20°/cm in an area of the ingot of which the temperature ranges from 1000 to 1100° during ingot growth. The temperature variation of the ingot can be measured at an outer circumferential part of the ingot and in a vertical direction.

The local heating element is installed between the heat shield and the ingot at the side of the region or area of the ingot at which the temperature is 1000 to 1000°. Also, the local heating element is supported by the heat shield by a connecting rod; for example, the local heating element can be arranged so as to be coupled to an end of a connecting rod which is installed at the heat shield so as to protrude from the heat shield toward the ingot.

The local heating element allows the adjustment of the temperature gradient, in a vertical direction (G) at an interface between the ingot and the silicon melt, measured at a center portion of the ingot, such that G is greater than or equal to 20°/cm. Also, the local heating element allows one to adjust and control the difference between the vertical temperature gradient at a center part of the ingot and the vertical temperature gradient at an outer circumferential part of the ingot to be less than or equal to 1.5°/cm, in a region of the ingot at which the temperature is 1000 to 1100° during the growth of the ingot.

The heat shield comprises a lower end portion that is located above the silicon melt and is from 10 to 40 mm thick, with a 15 to 40 mm gap between the heat shield and the ingot.

The invention also provides high-quality single-crystal silicon ingots, from which can be prepared equally high quality silicon wafers. Typically, the initial oxygen concentration of the ingot is 15 ppma or less. Along at least 40% or more of the length of ingot, the ingot has a radial area or region (cross-sectional area) characterized by vacancy defects of a size greater than or equal to a predetermined size that, typically can have an adverse effect on the voltage-resistance characteristics of an oxide layer on silicon wafers fabricated from the ingot. Typically, the critical size is taken as 0.065 micron (μm) or smaller.

Preferably, at least 40% or more of the entire length of the ingot body has a void density in the radial direction of less than or equal to 200 ea/cm2 characterized by measuring near surface micro defects (NSMD) of the wafer.

The invention also provides high-quality silicon wafers from which one can manufacture semiconductor and other electronic devices. The wafer has a region or area in which the vacancy defects each have a size greater than or equal to a predetermined size (which size is typically less than or equal to 0.065 microns). The area is preferably center-based (i.e., it extends radially from the center of the wafer) and occupies 80% or more of the radius of the wafer. The predetermined size has a critical impact on the voltage-resistance characteristics of the oxide layer on the silicon wafer, when measuring the voltage-resistance characteristics of an oxide layer after forming the oxide layer on the silicon wafer.

More specifically, an oxidation-induced stacking fault ring exists at an outer circumferential part of the wafer. Inside the oxidation-induced stacking fault ring, the vacancy defects are each of size greater than or equal to the aforementioned predetermined size. The oxidation-induced stacking fault ring can be located outside over 90% of a radius of the wafer, or deviate outside the radius of the wafer.

The application file contains at least one drawing executed in color. Copies of this patent application publication with color drawings will be provided by the Office upon request and payment of the necessary fee.

BRIEF DESCRIPTION OF THE DRAWINGS

The application file contains at least one drawing executed in color. Copies of this patent application publication with color drawings will be provided by the Office upon request and payment of the necessary fee.

These and other characteristics and advantages of the invention will become better understood when reference is made to the following detailed description and considered in conjunction with the accompanying drawings, wherein.

DETAILED DESCRIPTION OF THE PREFERRED EMBODIMENTS

Figure 1:
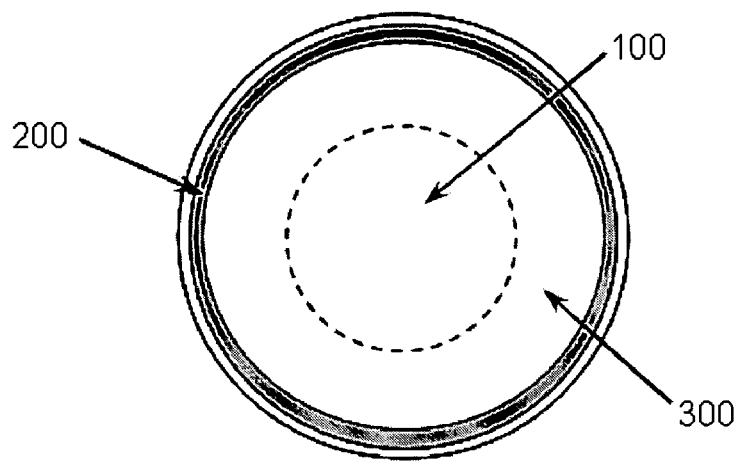
FIG. 1 is a cross-sectional view of an ingot illustrating a typical defect distribution of a crystal ingot grown by the Czochralski method.

The present invention enhances the voltage-resistance characteristic of an oxide layer in the single-crystal silicon grown by the Czochralski (CZ) method by growing a single-crystal silicon ingot in a manner whereby each micro defect is smaller than the critical size that adversely affects the voltage-resistance characteristic of an oxide layer (typically 0.065 microns), and each coarse defect larger than the critical size is distributed in the radial direction.

The voltage-resistance characteristic of an oxide layer of the device fabricated on the single crystal silicon substrate can be represented by the tolerable voltage and time before the silicon oxide layer formed on the silicon wafer is destructed and the insulating property of the silicon oxide layer is disappeared.

In one embodiment of the invention, the outer circumferential part of the ingot is cooled faster than the center part is cooled, and the thermal history of the ingot is uniformly distributed on the entire surface of a wafer formed therefrom. Also, coarse vacancy defects larger than the critical size are uniformly distributed in the radial direction by diffusing, concentrating, and developing the micro vacancy defects in consideration of the design rule of semiconductor fabrication processes.

Particularly, the hot zone is constructed so as to cause slow cooling in the temperature range between about 1000° C. and 1100° C., and the ingot is grown under a condition that the thermal history uniformity increases in the radial direction by adjusting the cooling condition, and then the ingot is then cut into wafers. As a result, thereby coarse vacancy defects are uniformly distributed in the radial direction in side the oxidation-induced stacking fault ring of each wafer.

The wafers so produced, having the appropriately controlled vacancy defects through the slow cooling and, especially, having the uniform vacancy defects distribution, are expected not to cause the problems seen during semiconductor device fabrication, as compared to wafers having non-uniform defect distribution. As a result, superior device yield is expected.

According to this new method, a single-crystal silicon ingot is grown using the Czochralski (CZ) method, but with the following improvement: the ingot is grown under the condition that the temperature variation ($\Delta T$) of the single-crystal silicon ingot is smaller than 20° C./cm between the temperatures of about 1000° C. and 1100° C., preferably measured at the outer circumferential part of the ingot. It is expected that the temperature variation is much smaller at the center part of the ingot.

Also, the temperature variation ($\Delta T$) means a temperature variation amount in longitudinal direction.

The variation ($\Delta G$) between the vertical temperature gradients at the center part and the outer circumferential part of the ingot can be obtained by simulating the above described ingot growth condition, and the resulting value is greater than or equal to 1.5° C./cm. Of course, the temperature of the ingot is in the range of about 1000 to 1100° C.

By growing the single-crystal silicon ingot in this manner, the vertical temperature gradient (G) at the interface between the ingot and the silicon melt (solid-molten interface) at the center portion of the ingot is greater than or equal to 20° C./cm. Due to the large G value, it is possible to increase the ingot pulling speed, resulting in increased productivity.

After fabricating a wafer by cutting the single-crystal silicon ingot grown in the hot zone condition that minimizes the difference of the thermal histories in the radial direction of the ingot and makes the entire volume of the ingot exist as a vacancy defect region, an inspection reveals that coarse vacancy defects, such as the crystal originated particle (COP) or flow pattern defect (FPD), are uniformly distributed along the entire region of the wafer in radial direction.

A wafer prepared from a single-crystal silicon ingot grown according to the present invention has a radially directed region occupying 80% of the entire wafer, within which the vacancy defects are no smaller than the predetermined critical size (described below) that adversely affects the voltage-resistance characteristic of the wafer's oxide layer. This condition is satisfied along total length portion of the ingot, greater than or equal to 40% of the entire length of the ingot.

Although the critical size of the vacancy defects that adversely affect the voltage-resistance characteristic of an oxide layer is not known precisely, typically it is determined to a limit value, 0.065 μm, which can be measured using a vacancy measurement apparatus (Equipment Name: KLA-Tencor Surfscan SP1). Vacancy defects can be divided into coarse vacancies and micro vacancies in comparison with the critical size.

A silicon wafer prepared from a single-crystal silicon ingot grown according to the present invention includes an oxidation-induced stacking fault ring at its outer circumferential part and a region in which the coarse vacancy defects are each of a size greater than or equal to 0.065 μm inside the oxidation-induced stacking fault ring.

According to measurements of the near surface micro defects(NSMD) of the silicon wafer measured using an apparatus denoted by its equipment name, MO601, the void defect density is less than or equal to 200 ea/cm$^2$.

The density condition preferably exists along a lengthwise portion of the ingot greater than or equal to 40% of the entire length of the ingot body, according to void density measurements (NSMD) using the MO 601 apparatus.

And, the initial oxygen concentration of a single crystal silicon ingot grown according to the present is below 15 ppma.

Figure 3:
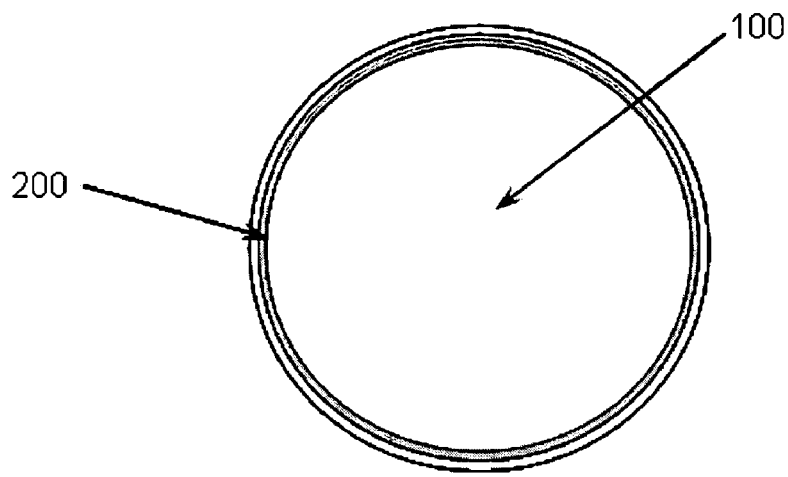
FIG. 3 is a cross-sectional view of an ingot illustrating the defect distribution in a cross-section of a single-crystal silicon ingot grown according to the present invention.

FIG. 3 is a cross-sectional view of a single-crystal silicon ingot grown according to the present invention, in the uniform hot zone where the growing and cooling conditions are uniform in radial direction. FIG. 3 illustrates the ingot's cross-sectional defect distribution.

An oxidation-induced stacking fault ring 200 is formed along the circumferential outer area of the wafer, and coarse vacancy defects (≧0.065 μm in size) are uniformed distributed inside the oxidation-induced stacking fault ring 200 so as to form a coarse vacancy defect area 100.

Here, the oxidation-induced stacking fault ring 200 that is formed is located at an outer circumferential region over 90% away from the center of the wafer along a radius, and the oxidation-induced stacking fault ring 200 can be completely removed outside the wafer. Accordingly, the coarse vacancy defect area 100 is relatively broadened in comparison with that of a conventional wafer.

Figure 2:
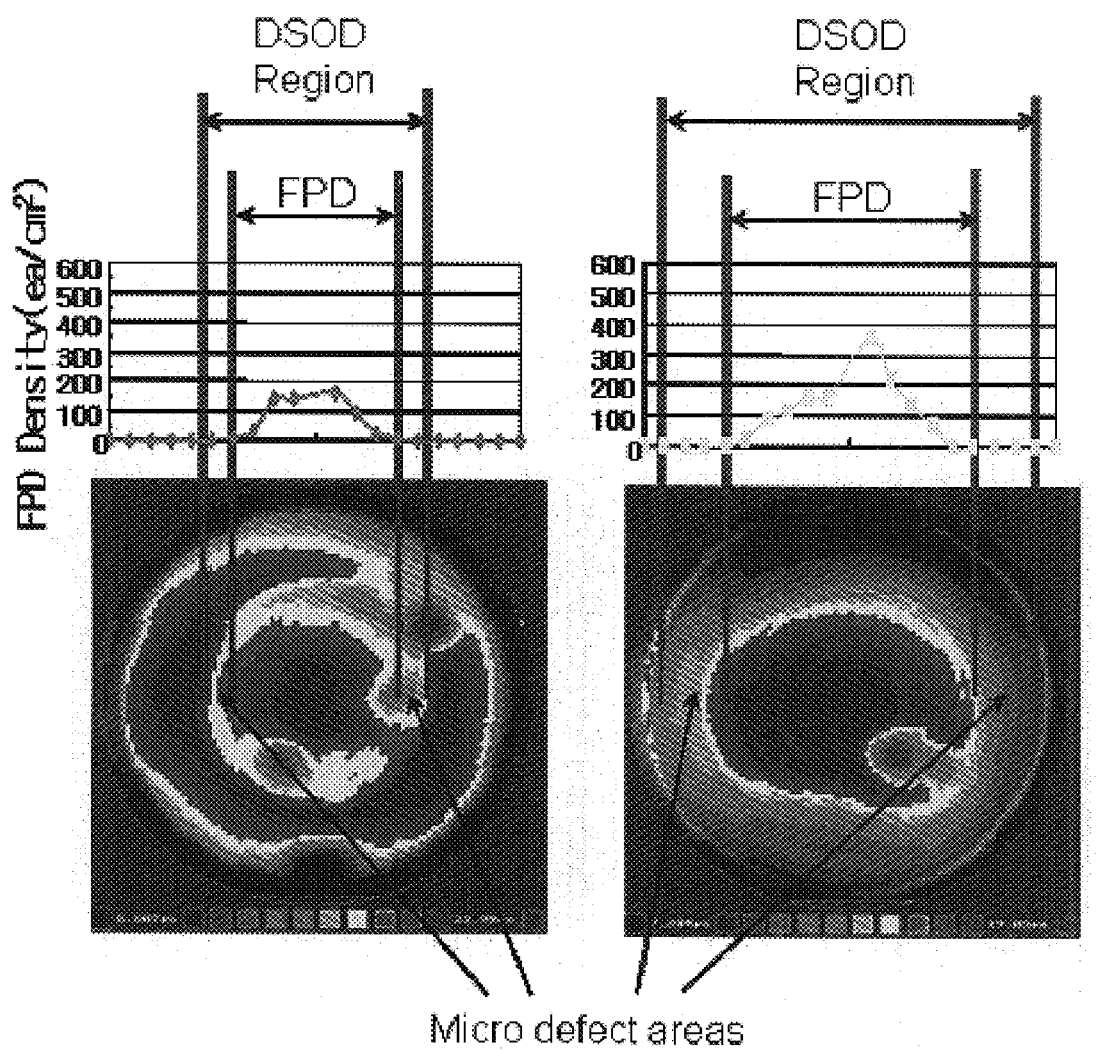
FIG. 2 is an image taken by minority carrier life time (MCLT) scanning of the cross-section of a single-crystal silicon ingot grown by the Czochralski method in a typical growing environment.

In comparison with the conventional ingot shown in cross-section in FIGS. 1 and 2, where the coarse vacancy area is limited at the center part and is surrounded by the micro defect area, the present invention causes the micro vacancy defects that existed in the micro defect area 100 to be distributed and agglomerated so as to grow larger than the critical size, with the slow cooling effect and uniform thermal history distribution, resulting in no deleterious effect on the voltage-resistance characteristic of the oxide layer of a wafer formed from the ingot.

In the improved process for growing the silicon ingot, differences in rates of cooling at different radial positions can be reduced by decreasing the cooling speed of the outer circumferential area of the ingot by appropriately designing the heat shield and adjusting the radiant heat from the silicon melt for maintaining the desired growing and cooling condition. Also, since the OISF ring, where the oxygen is deposited, is grown in the temperature below 900° C., the present invention is expected to suppress the OISF ring by increasing the temperature gradient around about 900° C., by adjusting the position of the heat shield and the structure of the hot zone.

Figure 4:
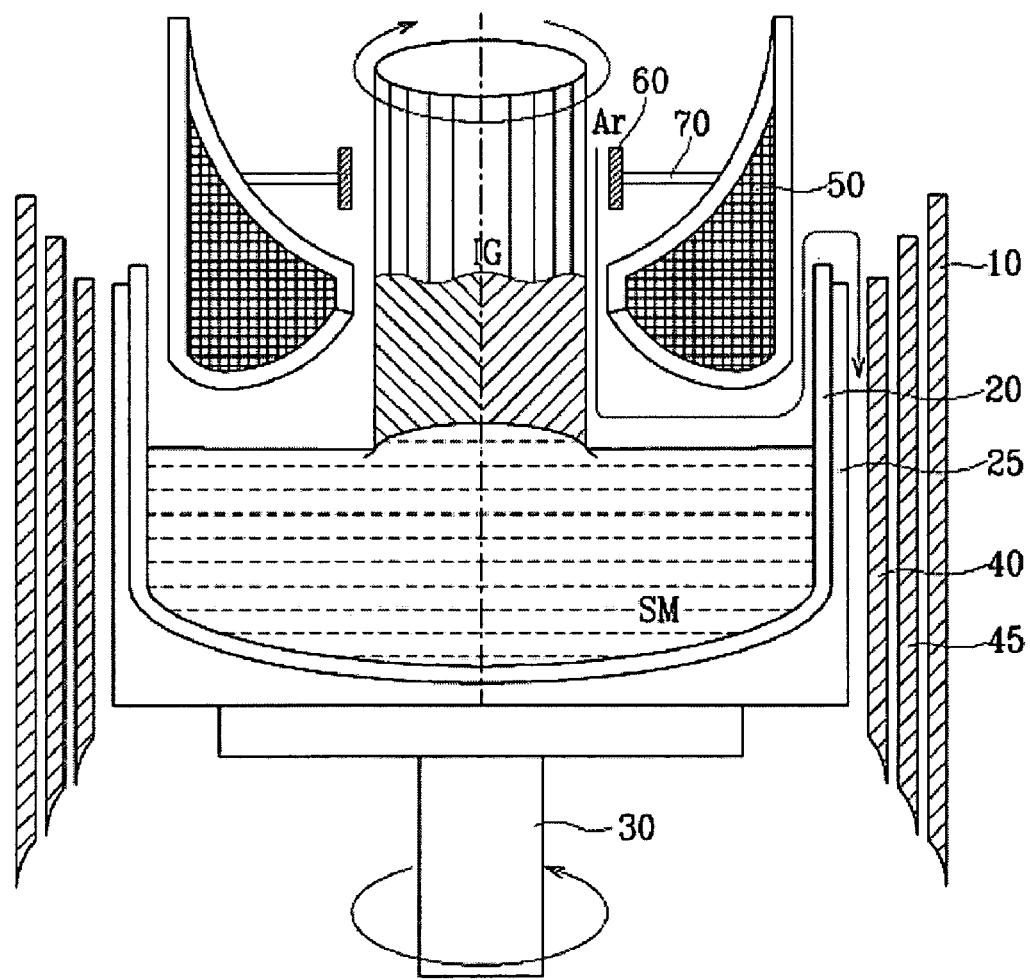
FIG. 4 is a cross-sectional view of the internal structure of an apparatus for growing a single-crystal silicon ingot according to the one embodiment of the present invention.

A cross-sectional view of one embodiment of an apparatus for growing a single-crystal silicon ingot is shown in FIG. 4. The apparatus for includes a chamber 10, in which the silicon single crystal ingot grows. In the chamber 10, a quartz crucible 20 containing the silicon melt (SM) is installed (located) and a crucible support 25 made of graphite is arranged so as to surround the quartz crucible 20.

The crucible support 25 is fixedly installed on a rotation shaft 30 which is driven by a drive mechanism (not shown) so as to rotatably pull up the quartz crucible 20 and keep the height of the quartz crucible 20 at the same height as the solid-liquid interface. The crucible support 25 is surrounded by a cylindrical heater 40 spaced apart a predetermined distance therefrom. The heater 40 is surrounded by a thermal insulator 45.

The heater 40 melts the polycrystalline silicon chunks loaded in the quartz crucible 20 and thereby forms a silicon melt (SM), and the thermal insulator 45 prevents the heat radiated from the heater 40 from diffusing to the wall of the chamber 10, and improves the thermal efficiency of the heating process.

At the upper part of the chamber 10 a pulling mechanism (not shown) is installed so as to roll up a cable that is provided with a seed crystal attached at the lower end thereof. The seed crystal contacts the silicon melt (SM) in the quartz crucible 20 and is carefully pulled up to grow the single-crystal ingot (IG).

The pulling mechanism rotates while pulling up the cable. The single crystal ingot (IG) is pulled up coaxially with the rotation shaft 30 of the crucible 20 while rotating in a direction opposite the rotation direction of the crucible 20.

From the upper part of the chamber, an inert gas such as argon (Ar) is supplied for the single-crystal ingot and the silicon melt (SM), and the spent inert gas is released through a lower part of the chamber 10.

Between the single-crystal ingot (IG) and the crucible 20, a heat shield 50 is arranged so as to shield the heat radiated from the ingot. Between the heat shield 50 and the ingot, a local heating element 60 is arranged along side the ingot, and maintains the ingot at a temperature in the range of 1000 to 1100° C., so as to slowly cool the outer circumferential area of the ingot (IG).

The heat shield is made of graphite coated with molybdenum (Mo), tungsten (W), carbon (C), or silicon carbide (SiC).

In one embodiment, the heat shield 50 is provided with a cylindrically shaped first shielding part arranged between the ingot (IG) and the crucible 20, a flange-shaped second shielding part connected to an upper region of the first shielding part and fixed to an upper region of the thermal insulator 45, and a third shielding part connected to a lower region of the first shielding part, and protrudes toward the single crystal ingot.

Alternatively, the heat shield 50 has a different configuration. Also, the local heating element 60 can be variously modified and located along side the ingot at a region where the ingot temperature is in the range of 1000 to 1100° C., regardless of the shape of the heat shield.

The local heating element 60 is supported by the heat shield 50 by means of a connecting rod, as shown in the FIG. 4, where the local heating element 60 is connected to a distal end of the connecting rod 70 installed at the heat shield 50 to protrude toward the ingot (IG). Alternatively, the local heating element 60 can be coupled to the heat shield 50 in some other manner.

The local heating element 60 provides temperature control and, in particular can restrict the temperature variation ($\Delta T$) of the outer circumferential area of the ingot to 20° C./cm or less while the ingot grows in the temperature range of 1000 to 1100° C.

Tt is expected enough that the temperature variation at the center area of the ingot is even smaller than at the outer circumferential area. The temperature variation ($\Delta T$) is measured in the vertical (longitudinal) direction of the ingot.

The variation ($\Delta G$) between the vertical temperature gradients at the center part and the outer circumferential part of the ingot can be obtained by simulating the above described ingot growing conditions, and the resulting value is greater than or equal to 1.5° C./cm.

By growing the silicon single crystal ingot in this manner, the vertical temperature gradient (G) at the interface between the ingot and the silicon melt (solid-molten interface) at the center part of the ingot is greater than or equal to 20° C./cm. This is accomplished by use of the local heating element 60. Due to the large G value, it is possible to increase the seed crystal pulling speed, resulting in increased productivity.

In order to obtain the ingot growth environment as described above, the local heating element is operated within a power range of 1–5 kW, by a thermal treating cycle.

Figure 5:
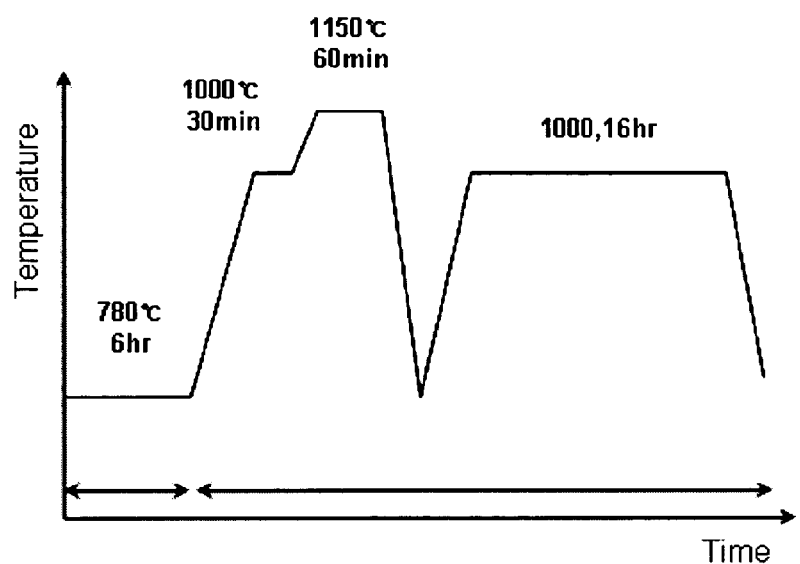
FIG. 5 is a graph illustrating an example of a heat treatment cycle of the local heating element according to one embodiment of the present invention.

FIG. 5 is a graph illustrating a non-limiting example of a heat treatment cycle for the local heating element. Alternatively, the heat treatment cycle can be changed according to the environment of the hot zone, taking into account the size of the ingot, shape of the heat shield, etc.

In conventional processing, an oxidation-induced stacking fault (OISF) ring is encountered when oxygen is deposited on the silicon ingot as the ingot temperature falls below 900° C. In the present invention, however, by adjusting the position and heating range of the local heating element, the temperature gradient in the vicinity of 900° C. is increased, and OISF ring formation is suppressed.

Also, in order to obtain the above-described ingot growth environment, the distance between the heat shield 50 and the ingot should be in the range of 15 to 40 mm, and the thickness of a lower part of the heat shield 50 located above the silicon melt (SM) should be in the range of 10 to 40 mm.

Figure 6:
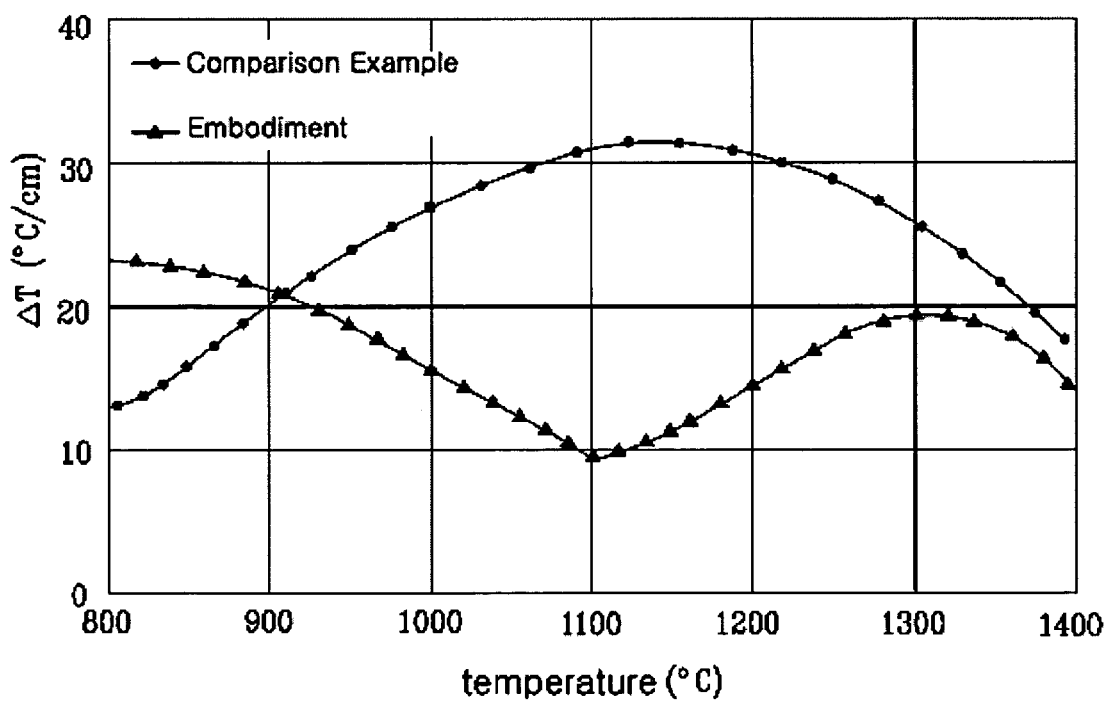
FIG. 6 is a graph illustrating simulated results of temperature variation ($\Delta T$) of an ingot in the temperature range of 1000 to 1100° C. when a single-crystal silicon ingot is grown according to one embodiment of the present invention.

FIG. 6 is a graph illustrating simulation testing results of the temperature variation ($\Delta T$) of the ingot in the temperature range of 1000 to 1100° C. while single-crystal silicon ingots are grown using the apparatuses according to the one embodiment of the present invention and the conventional Czochralski method, respectively. The temperature variation ($\Delta T$) of the ingot grown according to the present invention in the temperature range of 1000 to 1100° C. is less than or equal to 20° C./cm, which is less than that of the conventional method.

As described above, the silicon a single crystal silicon ingot grown, using the apparatus of the present invention, in the hot zone satisfying the conditions crystal uniform developing and for uniform crystal cooling, shows a cross-sectional defect distribution as shown in FIG. 3.

The cooling condition uniformity in the radial direction can be inspected using the halt test. A specific oxygen deposition pattern can be inspected according to the halt test disclosed in V. V. Voronkov and R. Falster, "Grown-in Microdefects, Residual Vacancies and Oxygen Precipitation Bands in Czochralski Silicon", Journal of Crystal Growth 204 (1999) 462.

Figure 7A:
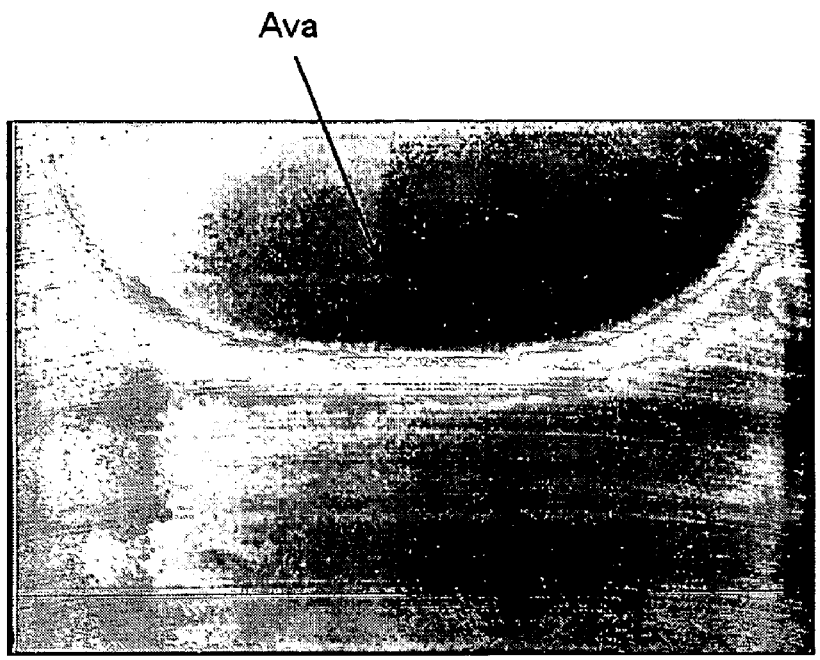
FIG. 7A is a drawing illustrating a vertical cross-section of an ingot that was subjected to a halt test in a conventional hot zone.

FIG. 7A is a vertical cross-sectional view of an ingot that was subjected to a halt test in a general hot zone. In FIG. 7A, the bright region is an oxygen precipitation-enhanced region, and a void nucleus-generated region (Ava) exists above the oxygen precipitation-enhanced region. Such a region appears in the portion of the ingot that experienced an excessive thermal history at a temperature of about 1070° C. during the halt test.

Figure 7B:
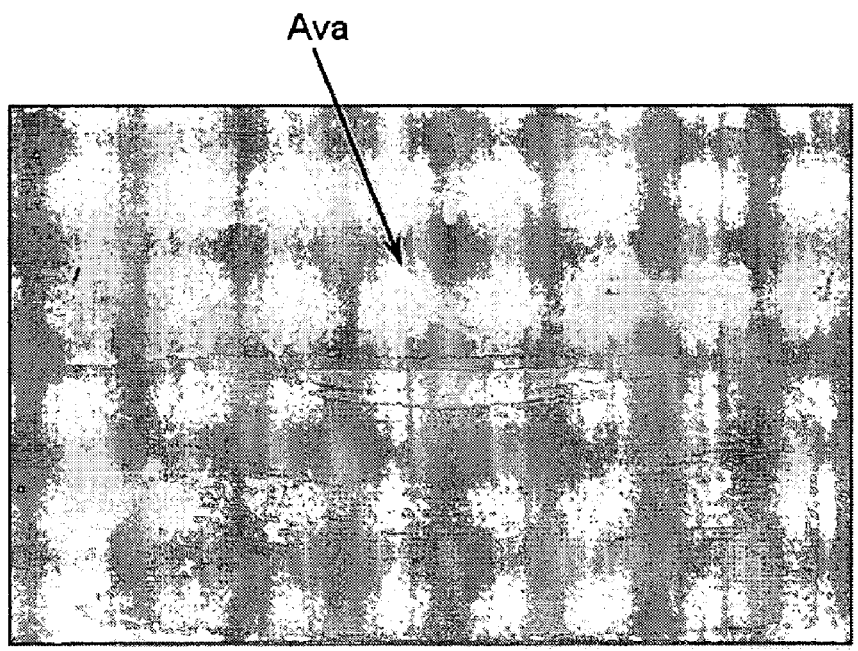
FIG. 7B is a vertical cross-sectional view of an ingot that was subjected to a halt test in a hot zone in which thermal conditions are uniformly controlled in a radial direction according to the present invention.

FIG. 7B is a vertical cross-sectional view of an ingot that was subjected to a halt test in a hot zone in which radial thermal conditions are uniformly controlled by the apparatus according to the embodiment of the present invention depicted in FIG. 4.

Compared to the vertical cross-sectional view in FIG. 7A, FIG. 7B shows that the boundary between the void nucleus-generating region (Ava) and the oxygen precipitation region is formed in parallel to the radial direction of the ingot. This indicates that the point defect concentration and cooling speed in the crystal are uniform in t-generating region (Ava) and the oxygen precipitation region is formed in parallel to the radial direction of the ingot. This indicates that the point defect concentration and cooling speed in the crystal are uniform in the radial direction.

Figure 8:
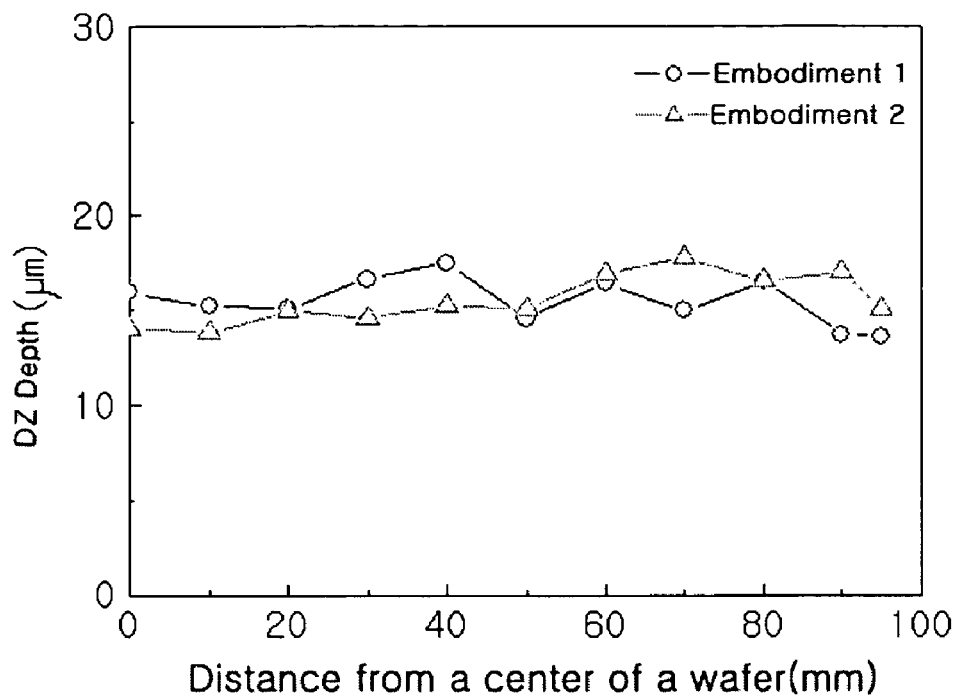
FIG. 8 is a graph illustrating a depth of denuded zone (DZ) in the radial direction of silicon wafers according to first and second embodiments of the present invention.
Figure 9:
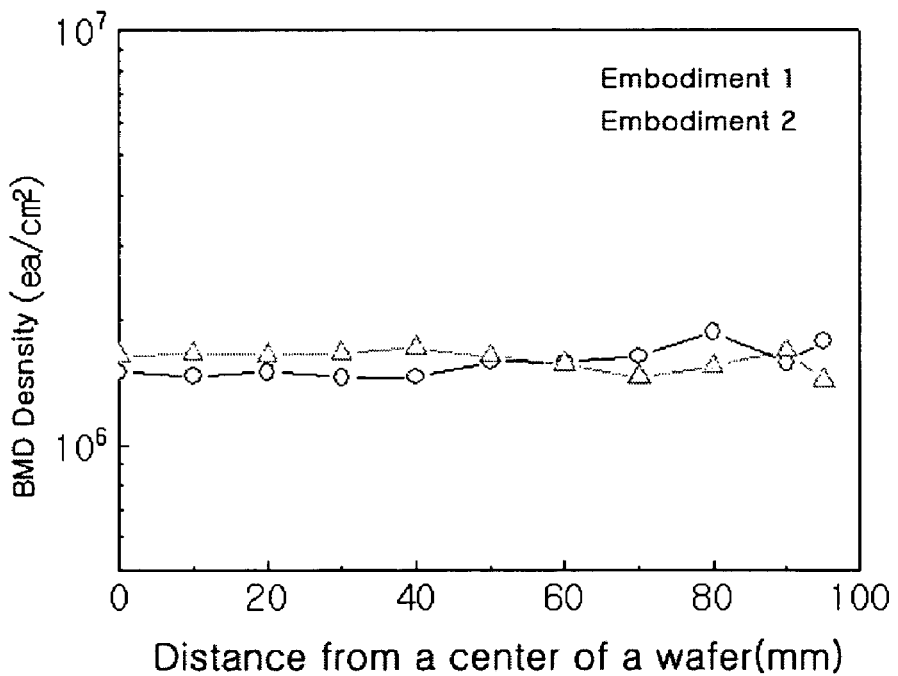
FIG. 9 is a graph illustrating bulk micro defect (BMD) density in the radial direction of silicon wafers according to first and second embodiments of the present invention.

FIG. 8 is a graph illustrating a depth of denuded zone (DZ) in the radial direction of silicon wafers according to the first and second embodiments of the present invention, and FIG. 9 is a graph illustrating a bulk micro defect (BMD) density in the radial direction of the silicon wafers according to the first and second embodiments of the present invention.

As shown in FIG. 8, it is found that non-defect areas are confirmed to a depth of 10 to 20 µm in accordance with the first and second embodiments of the present invention, and the non-defect regions are changed into widths of about 4 µm along the radial directions of the wafers so as to be relatively uniform.

Also, as shown in FIG. 9, it is found that the density of BMDs formed during gettering operations falls within the normal and accepted range of $10^5 \sim 10^6$/cm² in accordance with the first and second embodiments of the present invention, and such BMDs are uniformly distributed along the radial direction of the wafers.

Figure 10:
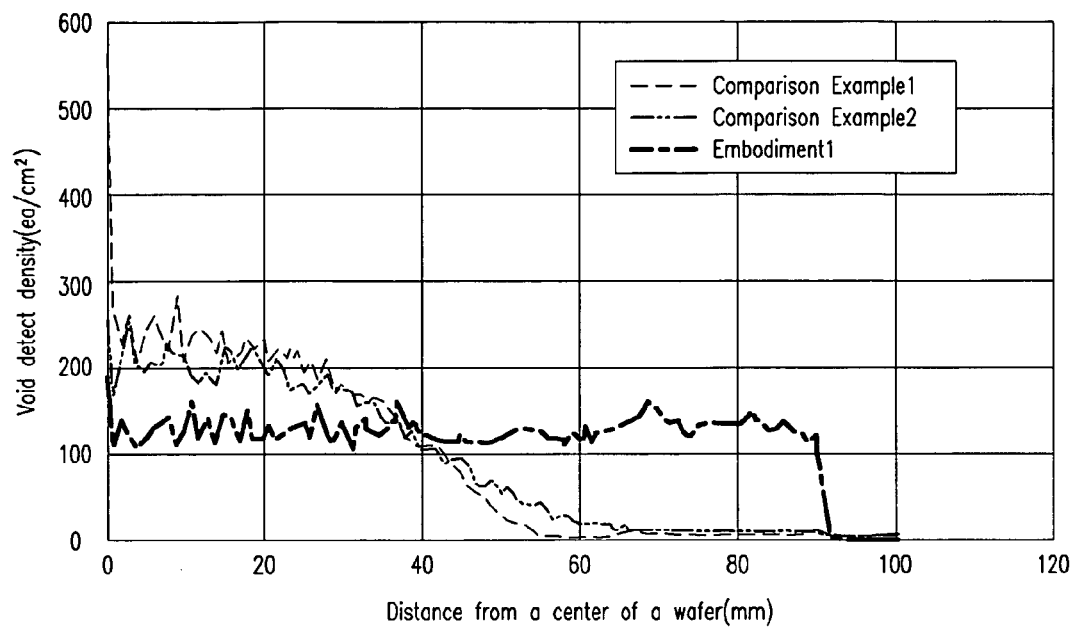
FIG. 10 is a graph illustrating the void density and distribution along the radial direction of a wafer according to a first embodiment of the present invention, and first and second comparison examples of the conventional Czochralski method.

FIG. 10 is a graph illustrating the void density and distribution along the radial direction of wafers according to the first embodiment of the present invention and the first and second comparison examples of a conventional Czochralski method.

As shown in FIG. 10, the void density of the wafer according to the first embodiment of the present invention is uniformly distributed in the radial direction. In contrast, in the first and second comparison examples the void densities decrease as one moves away from the center toward the outer circumferential areas of the wafer.

Figure 11A:
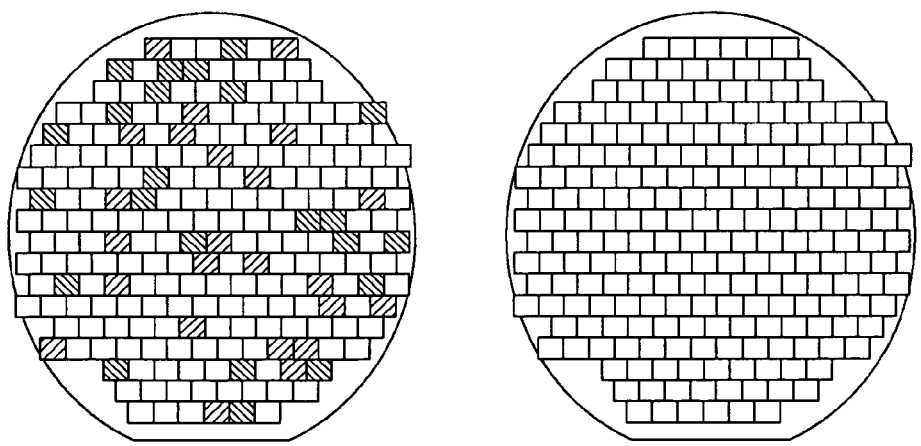
FIG. 11A is a drawing illustrating the voltage-resistance characteristic of an oxide layer on silicon wafers according to first and second embodiments of the invention.
Figure 11B:
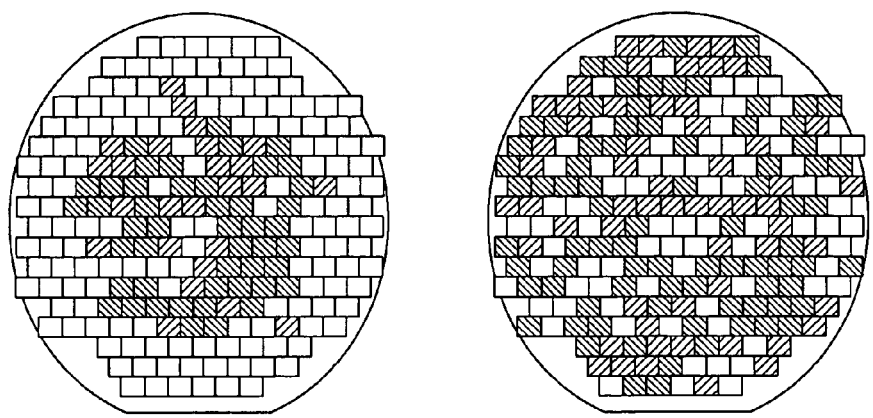
FIG. 11B is a drawing illustrating the voltage-resistance characteristic of an oxide layer on silicon wafers according to first and second comparison examples of the conventional Czochralski method.

FIG. 11A is a drawing illustrating the voltage-resistance characteristic of an oxide layer on silicon wafers according to the first and second embodiments of the invention, and FIG. 11B is a drawing illustrating the voltage-resistance characteristic of an oxide layer on silicon wafers according to the first and second comparison examples of the conventional Czochralski method. The hatched regions are defective regions due to the oxide layer's poor voltage-resistance characteristic, i.e., less than 8~10 MV/cm in voltage. The voltage-resistance characteristics of the first and second embodiments of the present invention are dramatically superior to those in the first and second comparison examples because the hatched regions indicating poor voltage-resistance characteristic is less in FIG. 11A than in FIG. 11B.

The present invention has been described in detail and with reference to preferred and other embodiments, but is not limited thereto. Other variations and/or modification of the basic inventive concepts taught herein, which may appear to persons skilled in the present art, will still fall within the spirit and scope of the present invention, as defined in the appended claims.

What is claimed is:

1. A silicon wafer prepared from a single-crystal silicon ingot grown by the Czochralski method, comprising:
a silicon wafer having an oxide layer and a region in which each vacancy defect is no smaller than a predetermined size, below which size the oxide layer has a voltage-resistance characteristic of less than 10 MV/cm, the region extending radially outward from the center of the wafer for at least 90% of a wafer radius.

2. The silicon wafer of claim 1, further comprising an oxidation-induced stacking fault ring along an outer circumferential part of the wafer, within which is located the region in which each vacancy defect is no smaller than the predetermined size.

3. The silicon wafer of claim 1, wherein the predetermined size is 0.065 μm.

4. The silicon wafer of claim 2, wherein the oxidation-induced stacking fault ring is displaced from the center of the wafer by more than 90% of a wafer radius.

5. The silicon wafer of claim 1, wherein the wafer having a void density in a radial direction less than or equal to 200 ea/cm$^2$ as determined by a near surface micro defect (NSMD) measurement.

6. The silicon wafer of claim 1, further comprising an outer circumferential region less than or equal to 20% of a wafer radius in which each vacancy defect is no larger than a predetermined size, above which size the oxide layer has a voltage-resistance characteristic of less than 10 MV/cm.

7. In a single-crystal silicon ingot grown by the Czochralski method, from which a silicon wafer having an oxide layer can be formed, the improvement comprising a region of the ingot in which each vacancy defect is no smaller than a predetermined size, below which size the oxide layer of a wafer formed from the ingot has a voltage-resistance characteristic of less than 10 MV/cm, the region extending radially outward from the ingot's axis for at least 80% of a wafer radius and lengthwise for at least 40% of the ingot's length.

8. The single-crystal silicon ingot of claim 7, wherein the predetermined size is 0.065 μm.

9. The single-crystal silicon ingot of claim 7, wherein a portion of the ingot extending at least 40% of the ingot's length has a void density less than or equal to 200 ea/cm$^2$, as determined by a near surface micro defect (NSMD) measurement in a wafer fabricated from the ingot.

10. The single-crystal ingot of claim 7, having an initial oxygen concentration of no more than 15 ppma.

11. The silicon wafer of claim 1, wherein each vacancy defect is no smaller than a predetermined size, below which size the oxide layer has a voltage-resistance characteristic of less than 8 MV/cm, the region extending radially outward from the center of the wafer for at least 90% of a wafer radius.

12. The silicon wafer of claim 6, wherein each vacancy defect is no larger than a predetermined size, above which size the oxide layer has a voltage-resistance characteristic of less than 8 MV/cm, the region extending radially outward from the center of the wafer for at least 90% of a wafer radius.

13. The silicon ingot of claim 7, wherein each vacancy defect is no smaller than a predetermined size, below which size the oxide layer of a wafer formed from the ingot has a voltage-resistance characteristic of less than 8 MV/cm, the region extending radially outward from the center of the wafer for at least 90% of a wafer radius.

* * * * *